(12) United States Patent
Losee et al.

(10) Patent No.: US 6,924,472 B2
(45) Date of Patent: Aug. 2, 2005

(54) IMAGE SENSOR WITH IMPROVED OPTICAL RESPONSE UNIFORMITY

(75) Inventors: David L. Losee, Fairport, NY (US); Stephen L. Kosman, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 272 days.

(21) Appl. No.: 10/292,344

(22) Filed: Nov. 12, 2002

(65) Prior Publication Data

US 2004/0089789 A1 May 13, 2004

(51) Int. Cl.[7] .............................................. H01L 31/00
(52) U.S. Cl. .............................. 250/214.1; 250/208.1; 257/432; 257/440
(58) Field of Search ........................... 250/214.1, 208.1; 257/294, 432, 435, 436, 440

(56) References Cited

U.S. PATENT DOCUMENTS

| | | | | |
|---|---|---|---|---|
| 5,442,207 A | * | 8/1995 | Jeong | 257/221 |
| 5,483,090 A | * | 1/1996 | Kitamura et al. | 257/231 |
| 5,585,653 A | * | 12/1996 | Nakashiba | 257/232 |
| 5,798,542 A | * | 8/1998 | Anagnostopoulos et al. | 257/232 |
| 5,804,845 A | * | 9/1998 | Anagnostopoulos et al. | 257/231 |
| 6,300,160 B1 | | 10/2001 | America et al. | 438/75 |
| 6,403,993 B1 | | 6/2002 | Losee et al. | 257/215 |
| 6,489,642 B1 | * | 12/2002 | America et al. | 257/232 |
| 6,525,356 B1 | * | 2/2003 | Murakami et al. | 257/294 |

* cited by examiner

*Primary Examiner*—David Porta
*Assistant Examiner*—Davienne Monbleau
(74) *Attorney, Agent, or Firm*—Peyton C. Watkins

(57) ABSTRACT

An image sensor includes a semiconductor substrate; a photosensor having, a first photosensing region including a first stack of one or more layers of transparent materials covering the substrate, the first photosensing region having a spectral response having minima and maxima as a function of wavelength of light; a second photosensing region including a second stack of one or more layers of transparent materials covering the substrate, the second photosensing region having a spectral response having maxima and minima; and a third photosensing region including a third stack of one or more layers of transparent materials covering the substrate, the third photosensing region having a spectral response having maxima and minima; and wherein at least one maximum or minimum of the spectral response of the separate regions is matched with a minimum or maximum such that the average spectral response of the photosensor has less variation with wavelength of light than the individual spectral responses of each of the separate photosensing regions.

9 Claims, 5 Drawing Sheets

IMAGE SENSOR WITH IMPROVED OPTICAL RESPONSE UNIFORMITY

FIELD OF THE INVENTION

The present invention relates to charge coupled image sensing devices having transparent gate electrodes and, more specifically, to such devices having a variation of spectral responsivity.

BACKGROUND OF THE INVENTION

Many charge coupled image sensing devices (CCDs), usually consisting of an array of pixels, require that light passes through the gate electrodes of the device before it is absorbed in the semiconductor substrate. To improve the sensitivity of such CCDs, transparent materials, such as indium-tin oxide (ITO), have been employed for one or more of the gate electrodes. Many devices, and, in particular, devices with all gates composed of ITO, employ Chemical Mechanical Planarization (CMP) processes in their fabrication (e.g. U.S. Pat. No. 6,300,160 or U.S. Pat. No. 6,403,993). A typical optical path for light to pass from air into the silicon substrate is shown schematically in FIG. 1. In FIG. 1 the silicon substrate 1, is covered with a gate dielectric, 2 a gate electrode 3, an overcoating dielectric layer 4 which has been subject to CMP processing, a passivation layer 5, and an anti-reflection coating 6. The thickness of layers 4 and 5 are indicated by dimensions 7 and 8.

In operation of an imaging device with such a structure, light must pass from the region above layer 6, through layers 6, 5, 4, 3, and 2, and be absorbed in the substrate 1. At each of the material interfaces of this structure, reflections can occur which produce optical interference which, in turn, leads to variations in the percent of light, as a function of wavelength, which penetrates into the silicon substrate 1. The degree of interference at any given wavelength is a complex function of the layer thicknesses and the indices of refraction of the various layers. Thus, if a given layer, 4 in this case, is of varying thickness across the array of pixels of the device, then the interferences will also vary across the array and thus the sensitivity of the device at any given wavelength will be varying. By way of example, FIG. 2 shows the calculated transmission of light into the silicon substrate as a function of wavelength for two different thicknesses of layer 4. In this figure, curves a and b represent the undulations in transmission of light into the silicon substrate for two thicknesses, respectively, of layer 4 which differ by 150 nm. It is evident that there is a significant difference in the transmission depending on the thickness of layer 4.

The processes and devices described in U.S. Pat. No. 6,300,160 or U.S. Pat. No. 6,403,993 disclose a device with all ITO electrodes which is fabricated using one or more CMP operations. Unfortunately, CMP inherently produces variations in the thickness of some of the layers overlying the gate electrodes. These layer thickness variations cause non-uniformities in the photoresponse of the devices. Such variation in photoresponse is undesirable. The present invention is directed toward improving the spectral response uniformity of image sensors wherein thickness of one or more of the constituent layers is non-uniform over the photosensitive area.

SUMMARY OF THE INVENTION

The present invention discloses a device with multiple areas within each picture element (pixel) wherein the spectral response of the various areas complement each other to provide a more uniform spectral response as well as a more uniform sensitivity, pixel-to-pixel, in the device. This is particularly applicable to devices which have one or more layers of non-uniform thickness in the path of the incident light. Incorporating a step of approximately ¼ wavelength height in the non-uniform layer within each pixel significantly reduces the spectral response non-uniformity over the array of pixels of the device. In addition, the non-uniformity may be reduced by employing gates of different thickness within each pixel of the sensor. An example is given in which the pixel is divided into four quadrants, each with its own spectral characteristics. In this example, one of the layers varies over the area of the device. By providing an etched step in this non-uniform layer and also providing two separate gate thicknesses, the uniformity of the device photoresponse is improved.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the following advantage of providing improved spectral response uniformity across the device. This may be applied to both single ITO gate devices as well as double ITO gate devices.

DETAILED DESCRIPTION OF THE INVENTION

Figure 1:
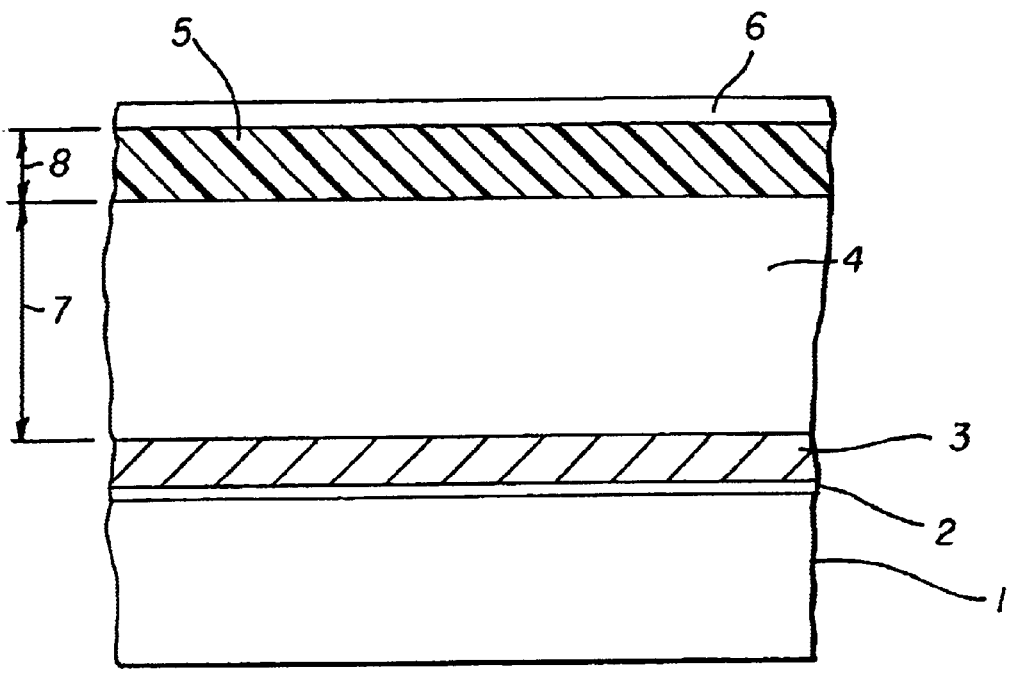
FIG. 1 is a CCD of the prior art.

It facilitates understanding to note that the substrate, gate dielectric, gate electrode, and passivation layer, are given the same numbers as in FIG. 1 for easy comparison to the prior art. It is to be understood that the anti-reflection layer 6, is omitted for clarity in the following descriptions, but may also be incorporated as an additional layer or part of the passivation layer.

Figure 3:
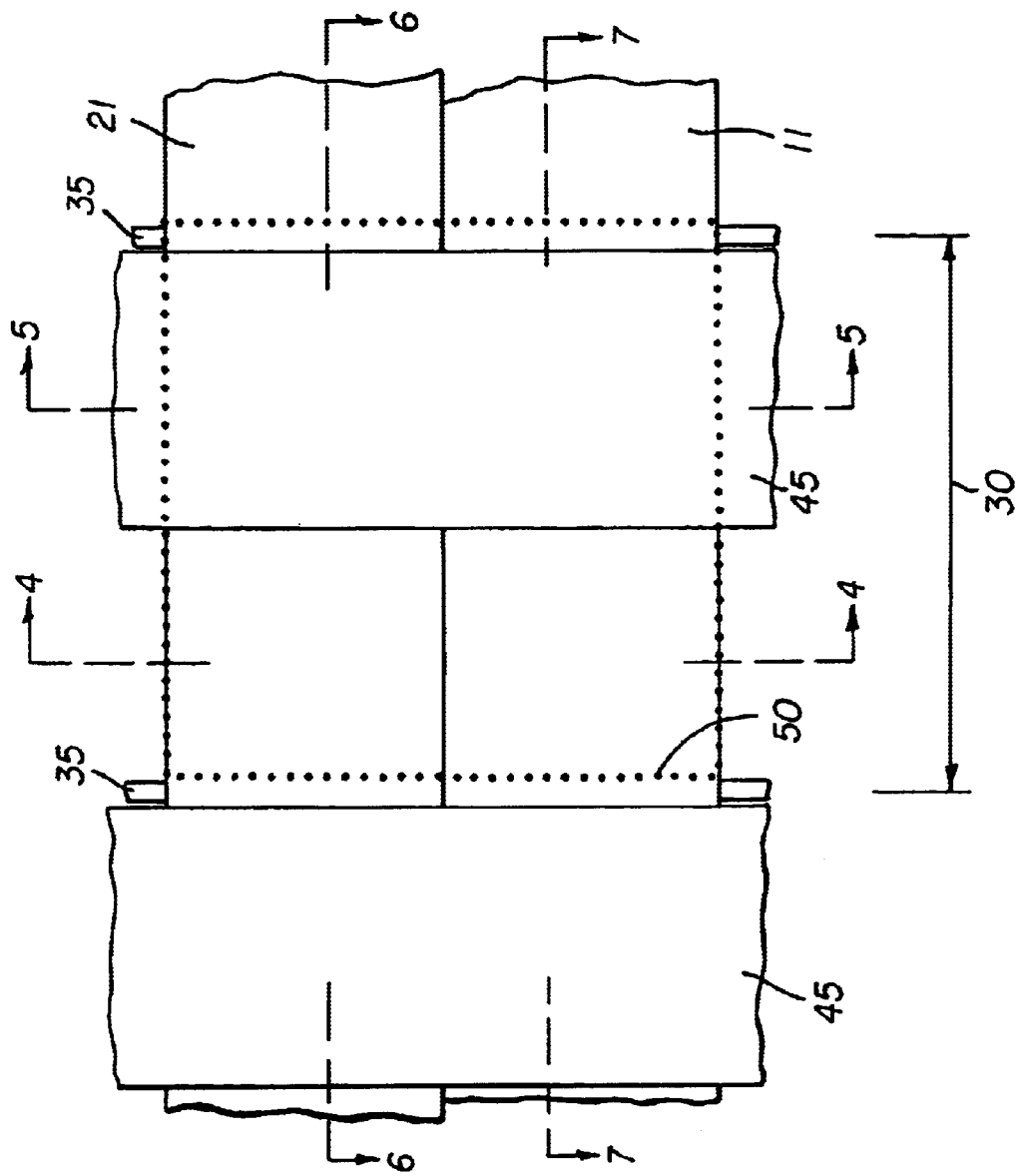
FIG. 3 is a plan view of the CCD of the present invention.

A plan view of the layout of a CCD pixel of the present invention is shown in FIG. 3. In this figure, transparent gates 11 and 21 lie over buried channel regions 30 and channel stop regions 35. The boundary of the pixel is indicated by the dotted line 50. Electrodes 11 and 21 may be of different thickness and of different materials. Covering electrodes 11 and 21 is an insulating layer which has been subjected to CMP. Into the insulating overlayer are etched troughs 45 of substantially uniform depth. An overcoating passivation layer then covers the pixel which may also include an antireflection layer.

Figure 4:
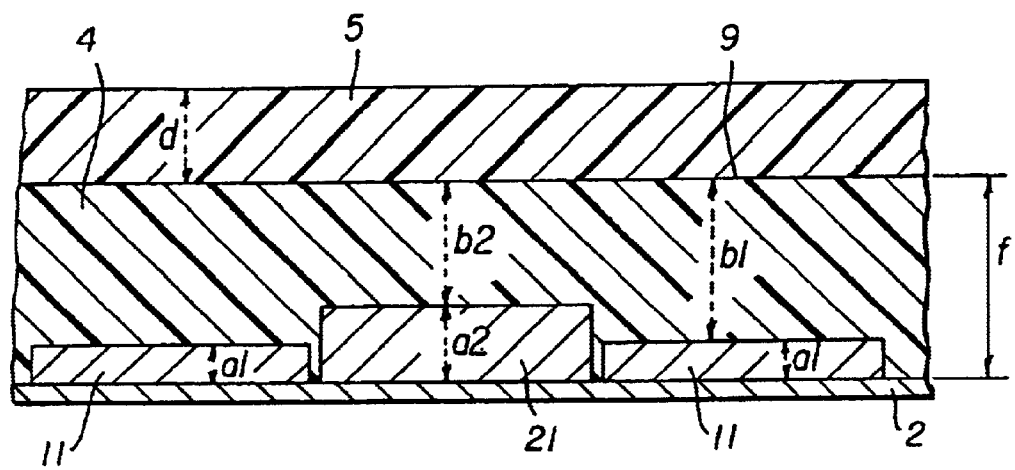
FIG. 4 is a cross-sectional view of FIG. 3 along line 4—4.
Figure 5:
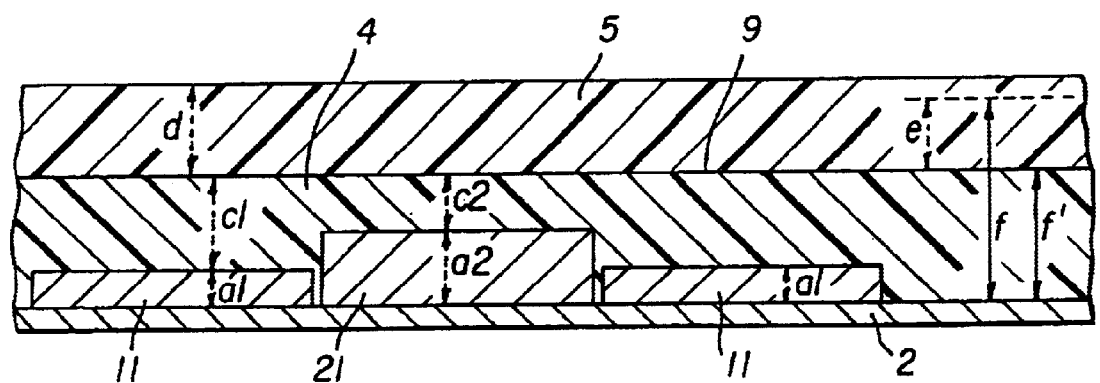
FIG. 5 is a cross-sectional view of FIG. 3 along line 5—5.

With the differing thickness of materials comprising each pixel there will be differing optical interferences and transmissions through the various regions of the pixel. In this layout there are four distinct combinations of layers. These are represented by cross-sections 4—4, 5—5, 6—6, and 7—7 and are shown schematically in FIGS. 4, 5, 6, and 7, respectively. In these figures, for clarity, channel stop region 35 has been omitted. In the figures, the thickness of gates 11 and 21 are indicated by dimensions $a_1$ and $a_2$ respectively; $b_1$ and $b_2$ are the thicknesses of layer 4, over gates 11 and 21 respectively, in regions of layer 4 between etched regions 45; dimensions $c_1$ and $C_2$ are the thicknesses of layer 4 over gates 11 and 21 respectively in etched regions 45. Dimension d is the thickness of layer 5. It is to be noted that the interface 9, between layers 4 and 5, is locally planar with a height f in FIG. 4, due to the CMP, and is similarly planar in FIG. 5 but with a reduced height f' due to the uniform etch, of depth e, in regions 45.

As can readily be seen from FIGS. 3, 4, 5, 6, and 7, there are four different layer thickness arrangements. If the thickness of layer 4 varies from place to place over the array of pixels due to the CMP processing, then gate thicknesses, $a_1$ and $a_2$, and etch depth e may be chosen to minimize the variation in spectral sensitivity, wherein the variation in the transmission of light through one region of the pixel complements the variation through another region. It is instructive to note that f represents the height of the top surface of layer 4 in an unetched region.

Figure 6:
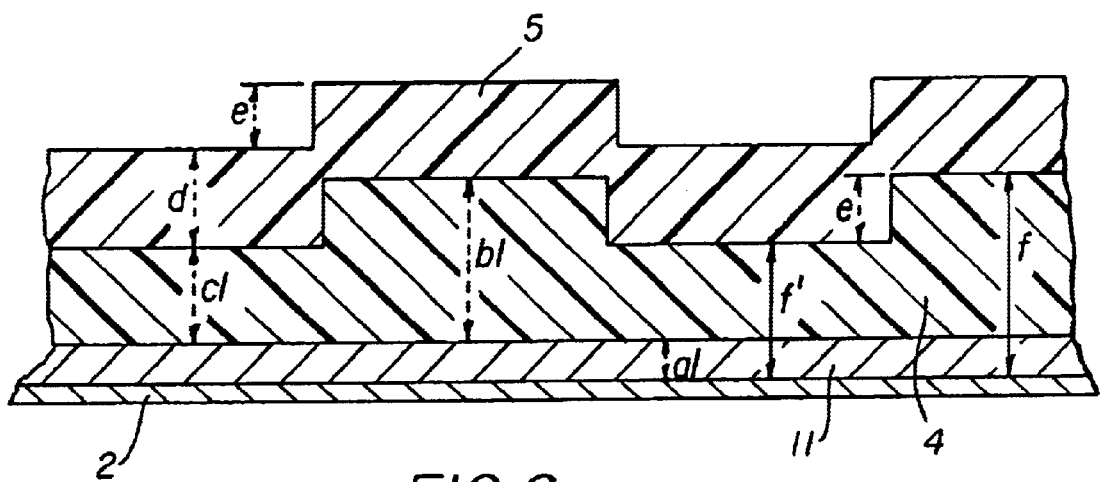
FIG. 6 is a cross-sectional view of FIG. 3 along line 6—6.
Figure 7:
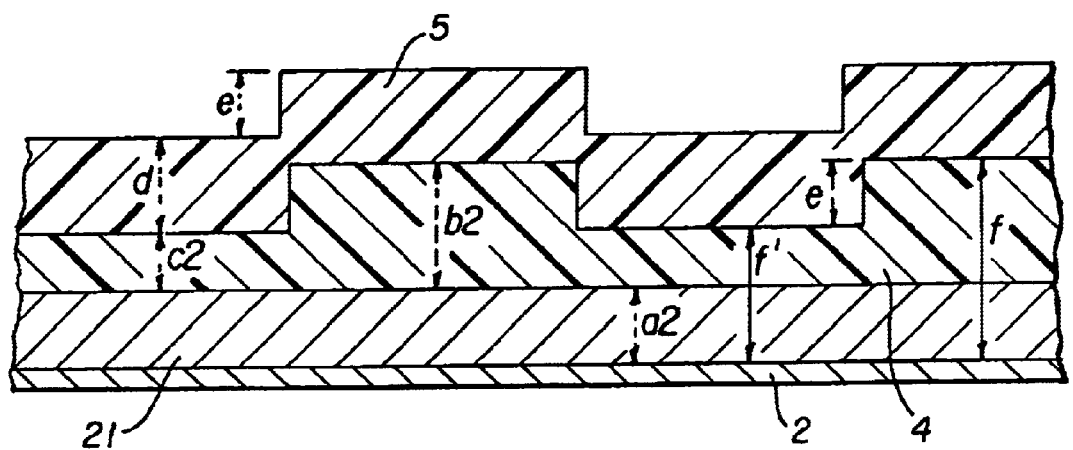
FIG. 7 is a cross-sectional view of FIG. 3 along 7—7.

The heights f and f' are also indicated in FIG. 6 and FIG. 7, where the cross-sections are taken through regions of gates 21 and 11, respectively. The physical mechanism of part of the spectral smoothing can be easily appreciated by considering either FIG. 6 or FIG. 7. In these figures, the thickness of layer 4 is governed by the gate thickness and the heights f or f' of the top of layer 4. The thickness of layer 4, at any given location across the pixel, is then one of two values, the difference between them being the etch depth e. If e is chosen to be approximately one quarter of the wavelength of light within layer 4, then the interference minima and maxima of transmission, as a function of wavelength, will be approximately complementary. That is, a minimum will occur for one region at approximately the same wavelength as a maximum for the other region. This complementary relationship is found to hold for varying values of f as long as the height difference e is maintained. Thus the variations in height f, across the device, due to the CMP processing, are minimized. Thickness difference between gates 11 and 21 provides additional spectral smoothing by further altering the relative wavelength positions for the interference maxima and minima.

Figure 2:
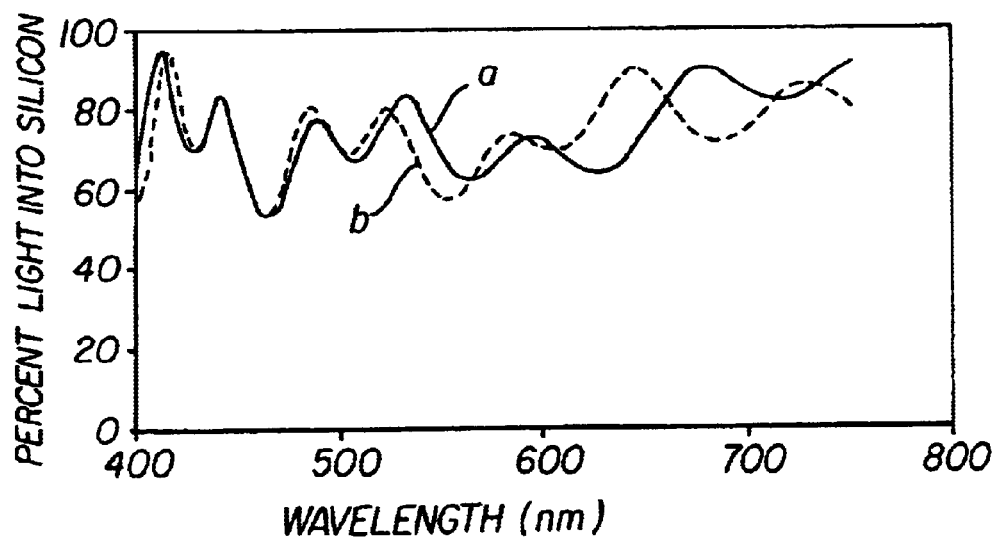
FIG. 2 is a drawing showing exemplary transmission as a function of wavelength for two different layer thicknesses.
Figure 8:
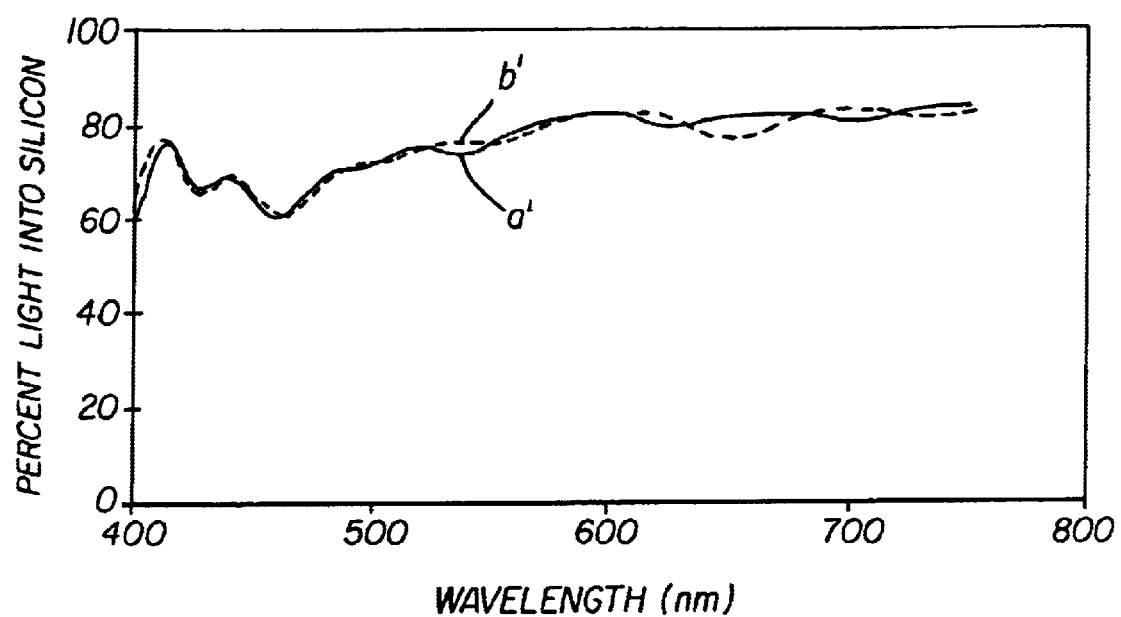
FIG. 8 is a drawing showing exemplary transmission as a function of wavelength for two device areas having different layer thicknesses wherein the improvements of the present invention are implemented.

As an example, the spectral variation seen in FIG. 2 can be almost entirely eliminated by the incorporation of an etched region 45, of depth 100 nm and a choice of ITO gate thickness 80 nm for gate 11, and 160 nm for gate 21. The calculated responsivity of the device, between regions having a 150 nm height difference due to CMP of layer 4, is shown in FIG. 8. In this figure, curves a' and b' correspond to regions with heights f differing by 1500 nm, as is typical of variations due to CMP processing. It is seen that the variation at any given wavelength, from place to place on the imager, is significantly reduced, compared to that seen in FIG. 2, as well as the spectral variation from wavelength to wavelength.

The invention has been described with reference to a preferred embodiment. However, it will be appreciated that variations and modifications can be effected by a person of ordinary skill in the art without departing from the scope of the invention.

PARTS LIST 1 silicon substrate
2 gate dielectric
3 gate electrode
4 overcoating dielectric layer
5 passivation layer
6 anti-reflection coating
7 dimension
8 dimension
9 interface
11 transparent gate or electrode
21 transparent gate or electrode
30 buried channel regions
35 channel stop regions
45 etched troughs
50 boundary of the pixel (dotted line)

What is claimed is:

1. An image sensor, comprising:
   a) a semiconductor substrate;
   b) a photosensor having,
      i) a first photosensing region including a first stack of one or more layers of transparent materials covering the substrate, the first photosensing region having a spectral response having first minima and first maxima as a function of wavelength of light;
      ii) a second photosensing region including a second stack of one or more layers of transparent materials covering the substrate, the second photosensing region having a spectral response having second maxima and second minima; and
      iii) a third photosensing region including a third stack of one or more layers of transparent materials covering the substrate, the third photosensing region having a spectral response having third maxima and third minima; and
   c) wherein at least one maximum or minimum of the spectral response of one of the photosensing regions is substantially matched with a minimum or maximum of another photosensing region such that the average special response of the photosensor has less variation with wavelength of light than the individual spectral responses of each of the separate photosensing regions.

2. The image sensor as in claim 1, wherein the number of layers and the materials in the separate regions are identical, and the thickness of one or more layers is different.

3. The image sensor as in claim 1, wherein the number of layers in two or more of the separate stacks and/or the materials is different.

4. The image sensor as in claim 1, wherein one of the layers in each stack is a gate electrode layer.

5. The image sensor as in claim 4, wherein at least one gate electrode layer is indium tin oxide.

6. The image sensor as in claim 5, wherein the gate electrode layer includes two or more stacks that are indium tin oxide.

7. The image sensor as in claim 6, wherein the gate electrode layers in two or more stacks are of different thicknesses.

8. The image sensor as in claim 1 further comprising a fourth photosensing region including a fourth stack of one or more layers of transparent materials covering the substrate, the fourth photosensing region having a spectral response having maxima and minima.

9. The image sensor as in claim 8 further comprising five or more photosensing regions including five or more stacks each of one or more layers of transparent materials covering the substrate, the five or more photosensing regions each having a spectral response having maxima and minima.

* * * * *